United States Patent
Nikipelov et al.

(10) Patent No.: US 11,874,607 B2
(45) Date of Patent: Jan. 16, 2024

(54) METHOD FOR PROVIDING A WEAR-RESISTANT MATERIAL ON A BODY, AND COMPOSITE BODY

(71) Applicant: ASML NETHERLANDS B.V., Veldhoven (NL)

(72) Inventors: Andrey Nikipelov, Eindhoven (NL); Antonius Franciscus Johannes De Groot, Lierop (NL)

(73) Assignee: ASML NETHERLANDS B.V., Veldhoven (NL)

( * ) Notice: Subject to any disclaimer, the term of this patent is extended or adjusted under 35 U.S.C. 154(b) by 59 days.

(21) Appl. No.: 17/606,493

(22) PCT Filed: Apr. 1, 2020

(86) PCT No.: PCT/EP2020/059188
§ 371 (c)(1),
(2) Date: Oct. 26, 2021

(87) PCT Pub. No.: WO2020/221539
PCT Pub. Date: Nov. 5, 2020

(65) Prior Publication Data
US 2022/0206396 A1    Jun. 30, 2022

(30) Foreign Application Priority Data
Apr. 30, 2019    (EP) .................................... 19171823

(51) Int. Cl.
*G03F 7/00*    (2006.01)
*H01L 21/687*    (2006.01)

(52) U.S. Cl.
CPC .......... *G03F 7/707* (2013.01); *H01L 21/6875* (2013.01); *H01L 21/68757* (2013.01)

(58) Field of Classification Search
CPC ........................... G03F 7/707; H01L 21/6875; H01L 21/68757
See application file for complete search history.

(56) References Cited

U.S. PATENT DOCUMENTS 6,307,620 B1 *  10/2001  Takabayashi ....... G03F 7/70916
                                                                    355/72
2007/0097346 A1    5/2007  Zaal et al.
(Continued)

FOREIGN PATENT DOCUMENTS

| EP | 0319926 | 6/1989 |
|----|---------|--------|
| EP | 1780601 | 2/2007 |

(Continued)

OTHER PUBLICATIONS

Taiwanese Office Action issued in corresponding Taiwanese Patent Application No. 111110451, dated May 30, 2022.
(Continued)

*Primary Examiner* — Deoram Persaud
(74) *Attorney, Agent, or Firm* — Pillsbury Winthrop Shaw Pittman, LLP (57) ABSTRACT

A method for providing a wear-resistant material on a body. A composite body that may be obtained by the method. The composite body may be a substrate holder or a reticle clamp for use in a lithographic apparatus. The method includes providing a body made of glass, ceramic or glass-ceramic; providing a wear-resistant material having a hardness of more than 20 GPa; and brazing or laser welding the wear-resistant material to the body.

20 Claims, 8 Drawing Sheets

(56) References Cited

U.S. PATENT DOCUMENTS

| | | | | |
|---|---|---|---|---|
| 2008/0138504 | A1* | 6/2008 | Williams | C23C 14/048 |
| | | | | 118/500 |
| 2008/0158538 | A1* | 7/2008 | Puyt | G03F 7/707 |
| | | | | 355/72 |
| 2010/0039747 | A1* | 2/2010 | Sansoni | H01L 21/67103 |
| | | | | 361/234 |
| 2011/0013164 | A1 | 1/2011 | Nayfeh et al. | |
| 2013/0301028 | A1 | 11/2013 | Albert et al. | |
| 2015/0093282 | A1* | 4/2015 | Bell | B23K 35/368 |
| | | | | 419/38 |
| 2016/0002774 | A1* | 1/2016 | Chae | H01L 21/68771 |
| | | | | 294/67.1 |

FOREIGN PATENT DOCUMENTS

| | | |
|---|---|---|
| JP | H07-138093 | 5/1995 |
| JP | 2002126997 | 5/2002 |
| JP | 2006156124 | 6/2006 |
| JP | 2007158309 | 6/2007 |
| JP | 2011510488 | 3/2011 |
| JP | 2011517299 | 6/2011 |
| JP | 2019009418 | 1/2019 |
| TW | 201001613 | 1/2010 |
| TW | 201237561 | 9/2012 |
| TW | 201503279 | 1/2015 |
| TW | 201623166 | 7/2016 |
| TW | 201906068 | 2/2019 |
| WO | 2017001135 | 1/2017 |

OTHER PUBLICATIONS

Communication pursuant to Article 94(3) issued in corresponding European Patent Application No. 20716758.6 dated Nov. 18, 2022.
International Search Report and Written Opinion issued in corresponding PCT Patent Application No. PCT/EP2020/059188, dated Jul. 9, 2020.
Taiwanese Office Action issued in corresponding Taiwanese Patent Application No. 109114010, dated Apr. 21, 2021.
Sechi, Y. et al.: "Dissimilar laser brazing of single crystal diamond and tungsten carbide", Transactions of JWRI, vol. 39, No. 2 (2010).
Carter, R.M. et al.: "Picosecond laser welding of similar and dissimilar materials", Applied Optics, vol. 53, No. 19 (Jul. 2014).
Office Action dated Nov. 9, 2022, issued in corresponding Japanese Patent Application No. 2021-560915, pp. 1-4.

* cited by examiner

METHOD FOR PROVIDING A WEAR-RESISTANT MATERIAL ON A BODY, AND COMPOSITE BODY

CROSS-REFERENCE TO RELATED APPLICATIONS

This application is the U.S. national phase entry of PCT Patent Application No. PCT/EP2020/059188 which was filed on Apr. 1, 2020, which is based upon and claims the benefit of priority of European Patent Application No. 19171823.8 which was filed on Apr. 30, 2019, each of which is incorporated herein in its entirety by reference.

FIELD

The present invention relates to a method for providing a wear-resistant material on a body, such as an unfinished substrate holder or an unfinished reticle clamp. The present invention also relates to a composite body, such as a substrate holder or a reticle clamp, comprising a wear-resistant material.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") of a patterning device (e.g., a mask) onto a layer of radiation-sensitive material (resist) provided on a substrate (e.g., a wafer).

The substrate is clamped onto a substrate holder in the lithographic apparatus when transferring a pattern from the patterning device. The substrate holder conventionally has a plurality of burls to support the substrate. The total area of the burls that contact the substrate is small compared to the total area of the substrate. Therefore, the chance that a contaminant particle randomly located on the surface of the substrate or the substrate holder is trapped between a burl and the substrate is small. Also, in manufacture of the substrate holder, the tops of the burls can be made more accurately coplanar than a large surface can be made accurately flat.

When a substrate is first loaded onto the substrate holder in preparation for exposure, the substrate is supported by so-called e-pins which hold the substrate at three positions. While the substrate is being held by the e-pins, its own weight will cause the substrate to distort, e.g. becoming convex when viewed from above. To load the substrate onto the substrate holder, the e-pins are retracted so that the substrate is supported by burls of the substrate holder. As the substrate is lowered onto the burls of the substrate holder, the substrate will contact in some places, e.g. near the edge, before other places, e.g. near the center. Any friction between the burls and the lower surface of the substrate may prevent the substrate from fully relaxing into a flat unstressed state. This can lead to focus and overlay errors during exposure of the substrate.

The substrate holder is commonly made of a ceramic material such as silicon carbide (SiC) or SiSiC, a material having SiC grains in a silicon matrix. Such a ceramic material can readily be machined to a desired shape using conventional manufacturing methods. When substrates are loaded and unloaded from the substrate holder, the ceramic material can wear quickly. The comparably high frictional coefficient of the ceramic material may also prevent the substrate from relaxing into a flat unstressed state when loaded onto the substrate holder.

It has been proposed to provide a layer of diamond-like carbon (DLC), for example DLC a-C:H, a-C or ta-C, on the burls of the substrate holder. Such a layer is resistant to wear and reduces the friction between the substrate holder and the substrate. DLC may be deposited directly onto the burls of the substrate holder, because deposition of DLC is possible at temperatures below 300° C. Temperatures exceeding 300° C. risk damage to the substrate holder.

The inventors have recognized that the performance of such DLC-coated substrate holders does not meet expectations. The DLC deposited on the substrate holder wears about 10 times faster than desirable, requiring re-polishing and re-conditioning of the substrate holder much sooner than the desired operational period.

SUMMARY

It is thus desirable, for example, to provide on a body a wear-resistant material with improved wear-resistant properties compared to a DLC-coated body. The wear-resistant material may also have other desirable properties compared to a DLC-coated body, such as improved corrosion resistance, for example.

According to an aspect of the invention, there is provided a method for providing a wear-resistant material on a body, the method comprising the steps of: providing a body made of glass, ceramic or glass-ceramic; providing a wear-resistant material having a hardness of more than 20 GPa; and brazing or laser welding the wear-resistant material to the body.

According to another aspect of the invention, there is provided a composite body comprising: a body made of glass, ceramic or glass-ceramic, a wear-resistant material having a hardness of more than 20 GPa, and an intermediate brazing layer or an interdiffusion layer connecting the body and the wear-resistant material.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIGS. 4A to 4D schematically depict an embodiment of the method for providing a wear-resistant material on a body.

FIGS. 5A to 5C schematically depict another embodiment of the method for providing a wear-resistant material.

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm) and extreme ultraviolet (EUV) radiation (e.g. with a wavelength around 13 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
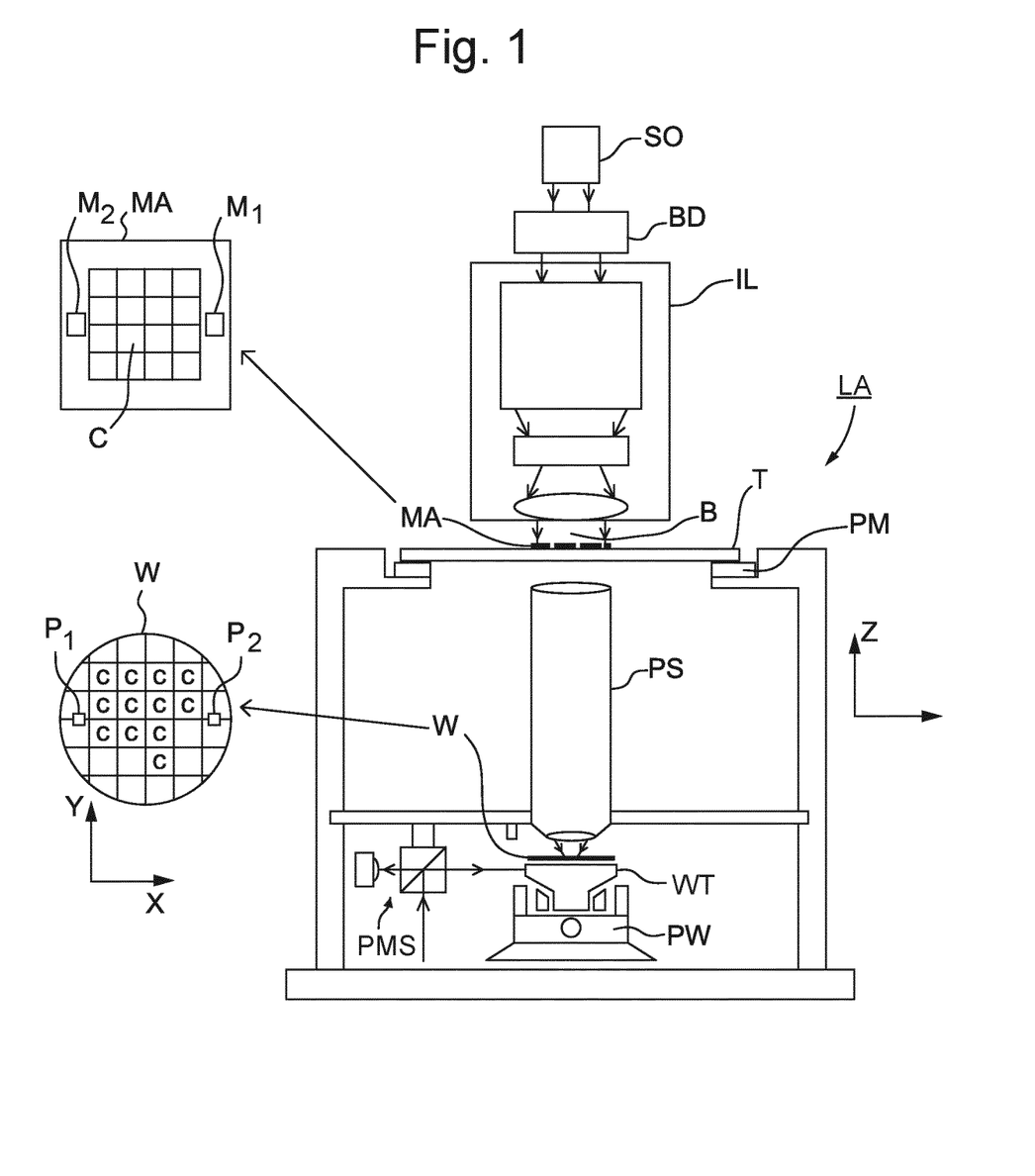
FIG. 1 schematically depicts a lithographic apparatus.

FIG. 1 schematically depicts a lithographic apparatus LA of an embodiment. The lithographic apparatus LA comprises:
- optionally, an illumination system (illuminator) IL configured to condition a radiation beam B (e.g. UV radiation or DUV radiation);
- a patterning device support structure (e.g. a mask table) T, usually comprising a reticle clamp constructed to support a patterning device (e.g. a mask) MA, and connected to a first positioner PM configured to accurately position the patterning device MA in accordance with certain parameters;
- a support table, e.g. a sensor table to support one or more sensors or a substrate table or wafer table WT constructed to hold a substrate (e.g. a resist-coated production substrate) W, connected to a second positioner PW configured to accurately position the surface of the table, for example of a substrate W, in accordance with certain parameters; and
- a projection system (e.g. a refractive projection lens system) PS configured to project a pattern imparted to the radiation beam B by patterning device MA onto a target portion C (e.g. comprising part of, one, or more dies) of the substrate W.

In operation, the illuminator IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system".

The lithographic apparatus LA may be of a type having two or more support tables, e.g., two or more support tables or a combination of one or more support tables and one or more cleaning, sensor or measurement tables. For example, the lithographic apparatus LA is a multi-stage apparatus comprising two or more tables located at the exposure side of the projection system PS, each table comprising and/or holding one or more objects. In an example, one or more of the tables may hold a radiation-sensitive substrate. In an example, one or more of the tables may hold a sensor to measure radiation from the projection system. In an example, the multi-stage apparatus comprises a first table configured to hold a radiation-sensitive substrate (i.e., a support table) and a second table not configured to hold a radiation-sensitive substrate (referred to hereinafter generally, and without limitation, as a measurement, sensor and/or cleaning table). The second table may comprise and/or may hold one or more objects, other than a radiation-sensitive substrate. Such one or more objects may include one or more selected from the following: a sensor to measure radiation from the projection system, one or more alignment marks, and/or a cleaning device (to clean, e.g., the liquid confinement structure).

In operation, the radiation beam B is incident on the pattern (design layout) present on patterning device (e.g., mask) MA, which is held on the patterning device support structure (e.g., mask table) T, and is patterned by the patterning device MA. Having traversed the patterning device MA, the radiation beam B passes through the projection system PS, which focuses the beam onto a target portion C of the substrate W. With the aid of the second positioner PW and position sensor PMS (e.g. an interferometric device, linear encoder, 2-D encoder or capacitive sensor), the substrate table WT can be moved accurately, e.g. so as to position different target portions C in the path of the radiation beam B at a focused and aligned position. Similarly, the first positioner PM and another position sensor (which is not explicitly depicted in FIG. 1) can be used to accurately position the patterning device MA with respect to the path of the radiation beam B. Patterning device MA and substrate W may be aligned using patterning device alignment marks M1, M2 and substrate alignment marks P1, P2. Although the substrate alignment marks P1, P2 as illustrated occupy dedicated target portions C, they may be located in spaces between target portions C (these are known as scribe-lane alignment marks).

Figure 2:
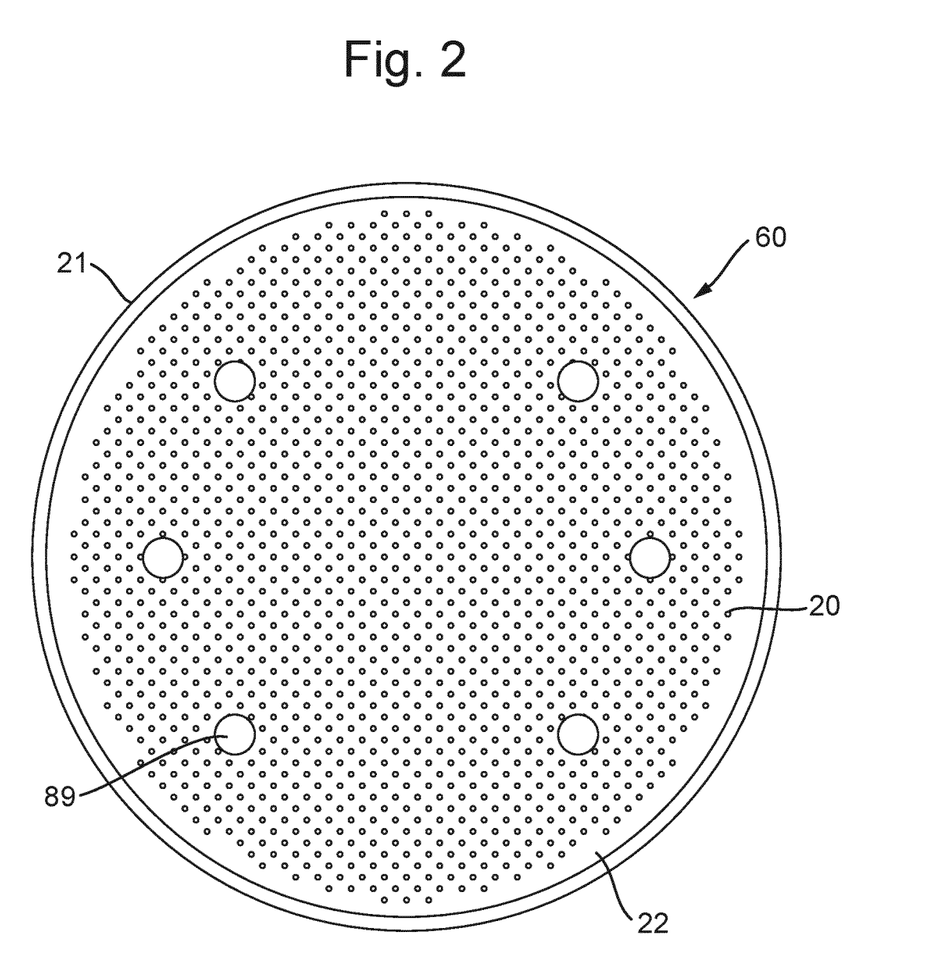
FIG. 2 depicts in plan a substrate holder, which is an example of a composite body according to an embodiment.

The substrate table WT comprises a substrate holder 60. FIG. 2 depicts a substrate holder 60 for use in the lithographic apparatus LA according to an embodiment. The substrate holder 60 is for supporting the substrate W. The substrate holder 60 comprises a main body 21. The main body 21 has a main body surface 22. A plurality of burls 20 are provided projecting from the main body surface 22. The distal end surface of each burl 20 engages with the substrate W. The distal end surfaces of the burls 20 are coplanar, i.e. the distal end surfaces of the burls 20 substantially conform to a support plane SP and support the substrate W. The main body 21 may be formed of a ceramic, for example SiC or SiSiC. The burls 20 may be formed of the same material as the main body 21, or may be formed of a different material.

Burls 20 may have a height in the range of from 10 μm to 500 μm, e.g. about 150 μm. The diameter of the distal end surface of burl 20 may be in the range from 100 μm to 300 μm, e.g. about 200 μm. The pitch of the burls 20 may be in the range from about 0.5 mm to 3 mm, e.g. about 1.5 mm. The pitch of the burls 20 is the distance between the centers of two adjacent burls 20. The total area of the distal end surfaces of all the burls 20 may be in the range of from 1% to 3% of the total area of the substrate holder 60. Burls 20 may be frusto-conical in shape, with burl side surfaces being slightly inclined. Alternatively, the burl side surfaces may be vertical or even overhanging. Burls 20 may be circular in plan. Alternatively, burls 20 can also be formed in other shapes if desired.

A plurality of through-holes 89 may be formed in the main body 21. Through-holes 89 allow the e-pins to project through the substrate holder 60 to receive the substrate W. Through-holes 89 may also allow the space between the substrate W and the substrate holder 60 to be evacuated. Evacuation of the space between the substrate W and the substrate holder 60 can provide a clamping force, if the space above the substrate W is not also evacuated. The clamping force holds the substrate W in place. If the space above the substrate W is also evacuated, as would be the case in a lithographic apparatus using EUV radiation, electrodes can be provided on the substrate holder 60 to form an electrostatic clamp.

Other structures, for example to control gas flow and/or thermal conductivity between the substrate holder 60 and the substrate W, can be provided. The substrate holder 60 can be provided with electronic components. Electronic components may comprise heaters and sensors. Heaters and sensors may be used to control the temperature of the substrate holder 60 and substrate W.

To reduce the wear and the friction of the burls 20, it has been proposed to deposit a layer of DLC on at least the distal end surfaces of the burls 20 of the substrate holder 60. However, the inventors have found that such a layer of DLC wears quicker than expected. This can be attributed to the presence of sp2 hybridized carbon in the DLC. Typically, DLC has an sp2:sp3 carbon ratio in the range from 10:1 to 1:1, and may include trapped hydrogen to form so-called H-DLC or a-C:H. While ta-C comprises carbon only, and so is not hydrogenated, it also contains sp2 carbon in lower concentrations. Sp2 hybridized carbon behaves similarly to graphite, and so is mechanically weak and electrically conducting, and may be subject to contact wear, tribocharging induced wear and oxidation. This leads to a faster than expected degradation of the DLC, especially in humid environments such as immersion lithographic apparatuses.

It is thus desirable to provide the substrate holder 60 with a wear-resistant material that withstands wear better than DLC. The inventors have found that such a wear-resistant material should have a hardness of more than 20 GPa, as determined by the Vickers hardness test. A hardness of more than 20 GPa ensures that the wear-resistant material is suitable for use on a body such as the substrate holder 60 or other support structure (e.g. a support structure comprised by support tables other than the substrate table WT, a substrate clamp, a reticle holder or reticle clamp for holding the patterning device MA) of the lithographic apparatus LA. The wear-resistant material is preferably a crystalline or at least nano-crystalline material, such as diamond, cubic boron nitride (c-BN), cubic silicon nitride ($Si_3N_4$), cubic carbon nitride ($C_3N_4$), $AlMgB_{14}$, $Al_2O_3$, $WB_4$, $V_yB_x$, $Ta_yB_x$, $Zr_yB_x$, $Nb_yB_x$, $c-BC_2N$, other C—B—N ternary compounds, or any combination thereof. Alternatively, the wear-resistant material may be, for example, amorphous DLC containing equal to or more than 50% sp3 carbon. Such a sp3 carbon content gives rise to internal mechanical stresses in the DLC, ensuring that the amorphous DLC has a hardness above 30 GPa. These materials are especially suitable for use as the wear-resistant material in the lithographic apparatus LA due to their very low wear and friction properties. Growing these materials on a growth substrate using enhanced vapour deposition (CVD, PVD, pulsed laser deposition) requires the growth substrate to be at an elevated temperature from 500° C. to 1200° C. Such a high temperature can lead to damage to the substrate holder 60 or other body to which the wear-resistant material is to be applied. Direct deposition of the wear-resistant material on the substrate holder 60 thus risks damage to the substrate holder 60.

The inventors have identified a new method of providing the wear-resistant material on a body made of ceramic, glass or glass-ceramic. One example of such a body is an unfinished substrate holder 60'. The invention is, however, not limited to applying the wear-resistant material on the unfinished substrate holder 60', thereby creating the substrate holder 60 for use in the lithographic apparatus LA. The invention extends to applying the wear-resistant material to any other body made of glass, ceramic or glass-ceramic. Bodies made of glass, ceramic or glass-ceramic can be easily machined using conventional manufacturing methods, and are thus particularly useful to form the base material for components such as those used in the lithographic apparatus LA.

Figure 3A:
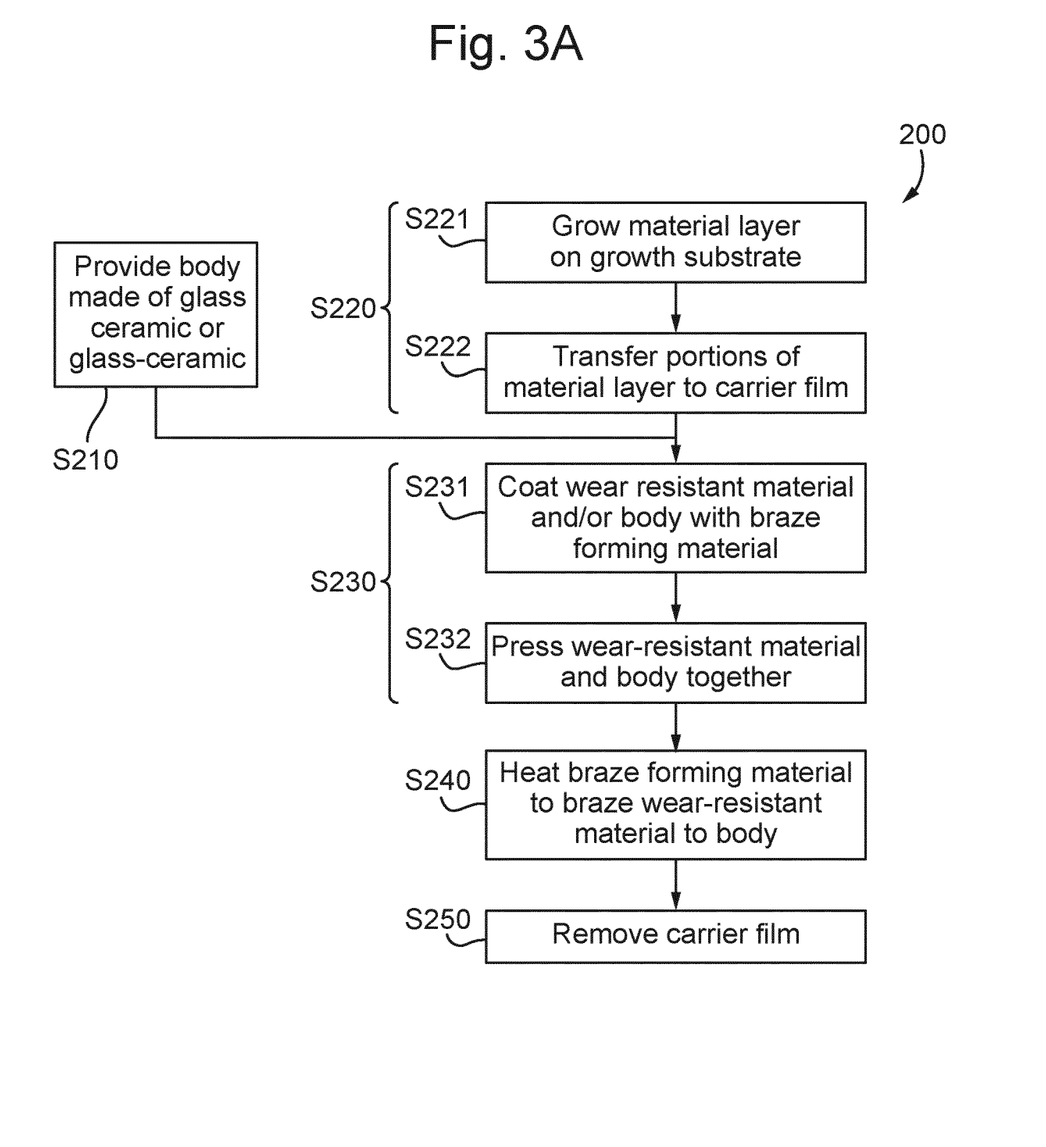
FIG. 3A depicts a method for providing a wear-resistant material on a body according to an embodiment.

An embodiment of the method 200 for providing the wear-resistant material on the body is depicted in FIG. 3A. The method 200 comprises providing the body made of glass, ceramic or glass-ceramic (S210). The body may be made of SiC or SiSiC, for example. The method 200 further comprises providing the wear-resistant material having a hardness of more than 20 GPa (S220). Examples of the wear-resistant material are diamond and c-BN, as well as the other wear-resistant materials mentioned above. Step S220 may include growing a material layer on a growth substrate (S221) and transferring portions of the material layer to a carrier film (S222), as depicted schematically in FIGS. 6A to 6D.

The method 200 further comprises providing, between the wear-resistant material and the body, a braze forming material suitable for brazing the wear-resistant material to the body (S230). This may include coating the wear-resistant material and/or the body with the braze forming material (S231) and pressing the wear-resistant material and the body together (S232), as depicted schematically in FIGS. 4A and 4B, and in FIGS. 5A and 5B. The method 200 further comprises brazing the wear-resistant material to the body by heating the braze forming material (S240). This is schematically depicted in FIGS. 4B and 5B. In a final step S250 of the method 200, the carrier film may be removed. The composite body obtained by the method 200 is depicted schematically in FIGS. 4D and 5C.

Figure 3B:
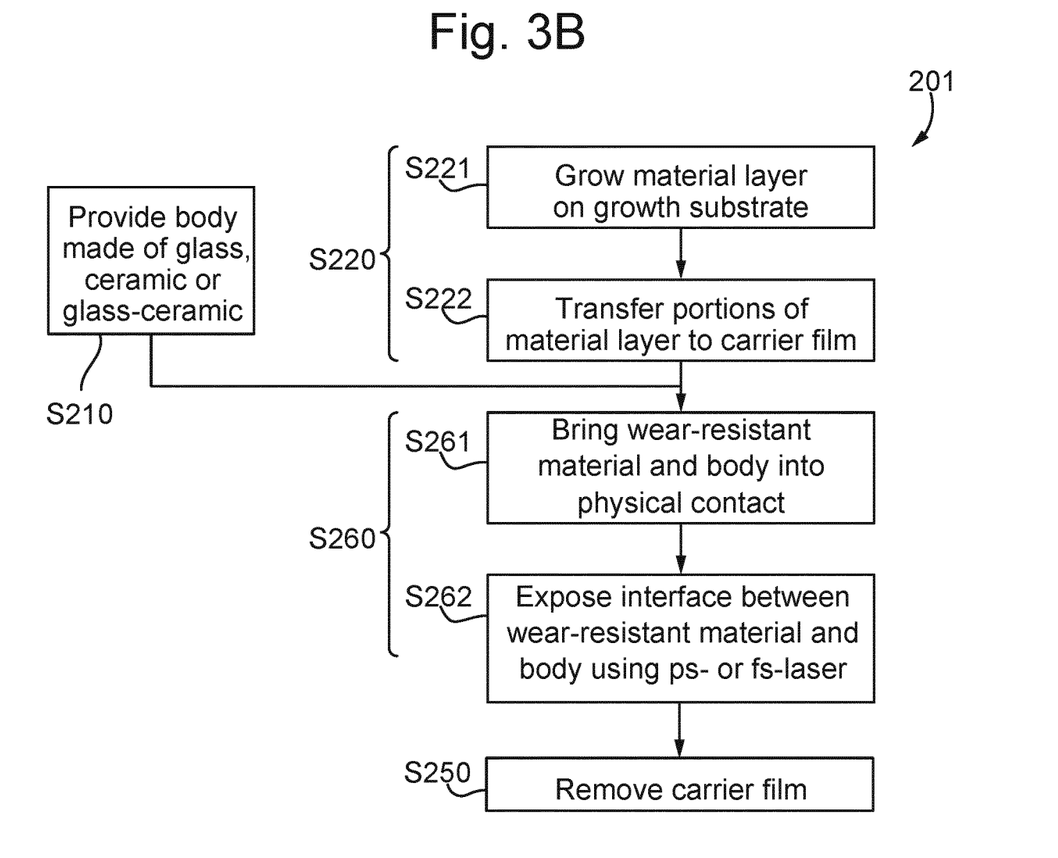
FIG. 3B depicts a method for providing a wear-resistant material on a body according to another embodiment.

FIG. 3B depicts an alternative embodiment of a method 201 for providing the wear-resistant material on the body. The method 201 comprises providing the body made of glass, ceramic or glass-ceramic (S210) and providing the wear-resistant material having a hardness of more than 20 GPa (S220), as already discussed in relation to the method 200 of FIG. 3A. However, compared to the method 200 of FIG. 3A, in the method 201 of FIG. 3B a braze-forming material is not provided between the wear-resistant material and the body. Instead, the wear-resistant material 30 is in direct physical contact with the body. The method 201 comprises laser welding (or laser-induced welding) the wear-resistant material to the body (S260). This comprises bringing the wear-resistant material into direct physical contact with the body (S261) and exposing the interface between the wear-resistant material and the body using a ps- or fs-pulsed laser. The wear-resistant material and the carrier film may be transparent to the ps- or fs-laser, and the body may be opaque to the ps- or fs-laser. The interface between the wear-resistant material and the body may thus be exposed by the ps- or fs-pulsed laser through the wear-resistant material and the carrier film.

The methods 200 and 201 can be used to apply the wear-resistant material to the body without relying on growing the wear-resistant material directly on the body (which requires high temperatures), and so reduces the risk of damaging the body. Instead, the wear-resistant material can be grown under optimal conditions and at high temperatures on a growth substrate different from the body, allowing a high-quality wear-resistant material to be obtained. Subsequent brazing or laser welding of the wear-resistant material to the body ensures a strong connection between the body and the wear-resistant material. Such brazing may require lower temperatures that growing the wear-resistant material directly on the body, or may require only localized heating of the braze forming material and surrounding areas, thus reducing the risk of damage to the body compared to a situation in which the entire body is heated to high temperatures to grow the wear-resistant material on the body. Similarly, laser welding requires only highly localized heating of the interface between the wear-resistant layer and the body, thus also reducing the risk of damage.

FIGS. 4A to 4D show one embodiment of the method 200 for providing the wear-resistant material 30 having a hardness of more than 20 GPa on the body. In this embodiment, the body is the unfinished substrate holder 60'. The unfinished substrate holder 60' comprises a main body 21 having the main body surface 22 and a plurality of unfinished burls 20' projecting from the main body surface 22.

Figure 4A:
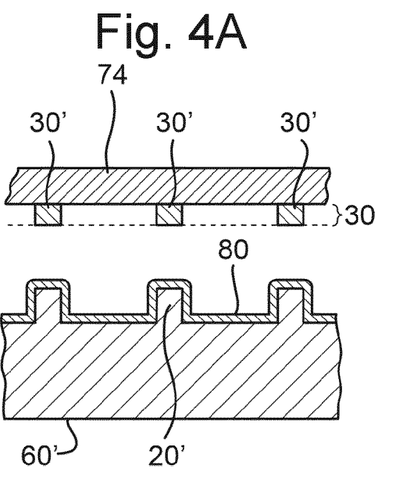
Figure 4B:
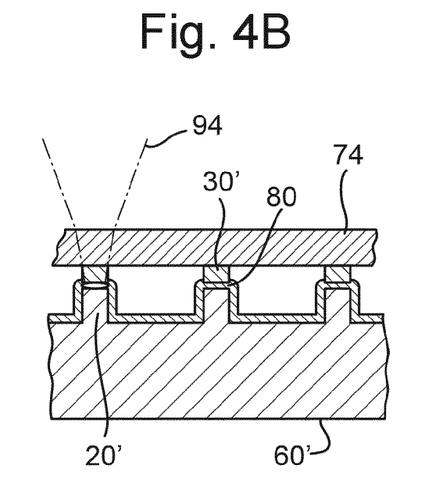

As shown in FIG. 4A, the wear-resistant material 30 may be provided in form of a layer, and may thus be a wear-resistant layer. This makes use of the wear-resistant material 30 in a support structure (such as the substrate holder 60) simple, as the wear-resistant layer is especially suitable to define a support plane SP for supporting an object without requiring excessive polishing after deposition of the wear-resistant layer on the support structure. The wear-resistant material 30 preferably has a thickness in the range from 0.1 to 500 µm.

The wear-resistant material 30 may be provided in a plurality of separated portions 30'. It is desirable for the separated portions 30' to have a diameter $d_i$ or average lateral dimension, when viewed in plan, of less than 2 mm, or preferably less than 500 µm.

Providing the wear-resistant material 30 in a plurality of separated portions 30' allows the wear-resistant material 30 to be provided on the distal end surfaces of the unfinished burls 20' of the unfinished substrate holder 60' (as in FIGS. 4A to 4D). In this case, the wear-resistant material 30 preferably has a thickness $t_1$ (in a direction perpendicular to the main body surface 22) from 0.1 µm to 10 µm. The pattern formed by the wear-resistant material 30, and in particular by the separated portions 30' of the wear-resistant material 30, is preferably geometrically similar or identical to the pattern formed by the plurality of unfinished burls 20'. Alternatively, the pattern formed by the (separated portions 30' of the) wear-resistant material 30 may be geometrically similar or identical to the pattern formed by a subset of the plurality of unfinished burls 20', for example every second or every third unfinished burl 20'. This allows application of the wear-resistant material 30 to the plurality of unfinished burls 20' in two or more stages, such that for example the first half of the unfinished burls 20' is provided with the wear-resistant material 30 in a first stage and the second half of the unfinished burls 20' is provided with the wear-resistant material 30 in a second stage. The diameter $d_1$ of each of the separated portions 30' may be equal to or less than the diameter of the unfinished burls 20', and for example be in the range from 50 µm to 300 µm, e.g. about 200 µm. The distance between the centers of two adjacent separated portions 30' may be equal to the pitch of the unfinished burls 20', and for example be about 0.5 mm to 3 mm, e.g. about 1.5 mm. The shape of the separated portions 30' may be geometrically similar to the shape of the distal end surfaces of the unfinished burls 20', and for example be circular in plan. The separated portions 30' can also be formed in other shapes if desired.

As shown in FIG. 4A, providing the wear-resistant material 30 preferably comprises providing the wear-resistant material 30 on a carrier film 74. This allows simple and accurate placement of the wear-resistant material on the body. When the wear-resistant material is provided in a plurality of separated portions 30', the carrier film 74 also serves to define the relative position of the separated portions 30' to each other and to the body to which the separated portions 30' are to be applied. The carrier film 74 is preferably substantially flat. The carrier film 74 may be transparent, for example to a brazing laser used for brazing or a ps- or fs-pulsed laser used for laser welding. Preferably, the carrier film 74 is stiff compared to the wear-resistant material 30 and flexible compared to the body. Providing a carrier film 74 that is stiff compared to the wear-resistant material 30 ensures that good contact can be achieved between each of the separated portions 30' of the wear-resistant material 30 and the body when placing the wear-resistant material 30 on the body. Optionally, an adhesive layer (not shown) may be provided between the wear-resistant material 30 and the carrier film 74 to stabilize the wear-resistant material 30 or the separated portions 30' of the wear-resistant material 30 on the carrier film 74. The adhesive properties of the adhesive layer may be reversible, for example by heating the adhesive layer, to allow detachment of the carrier film 74 from the wear-resistant material 30 when desired (e.g. after the step S240 of brazing). The adhesive layer may be transparent, to allow a laser to pass through the adhesive layer.

FIGS. 4A and 4B schematically depict the step S220 of providing, between the wear-resistant material 30 and the body (which is the unfinished substrate holder 60'), the braze forming material 80. The braze forming material 80 is suitable for brazing the wear-resistant material 30 to the unfinished substrate holder 60', i.e. the braze forming material 80 chemically reacts with the wear-resistant material 30 and the unfinished substrate holder 60' upon heating so as to form an intermediate brazing layer 81, 82 connecting the wear-resistant material 30 to the unfinished substrate holder 60'. For example, when the unfinished substrate holder 60' is made of SiC or SiSiC, the braze forming material 80 may form carbides or silicides with the SiC or SiSiC of the unfinished substrate holder 60'. When the wear-resistant material 30 is made of diamond, the braze forming material 80 may also form carbides with the diamond.

The braze forming material 80 may be selected from the group of braze forming materials 80 consisting of Ti, Zr, Mo, Cr, Nb, V, Ta, Ni, Fe, Co, Al, Ag, Au, C, Si, B and combinations thereof. The choice of a suitable braze forming material 80 will depend on the specific wear-resistant material and on the specific glass, ceramic or glass-ceramic making up the body. For example, when the body is made of SiC or SiSiC and the wear-resistant material is diamond, the braze forming material 80 is preferably selected from the group of braze forming materials 80 consisting of Ti, Zr, Mo, Cr, Nb, V, Ta, C, Si and B, and combinations thereof. For example, the braze forming material 80 may be Ag—Cu—Ti. When the body is made of SiC or SiSiC and the wear-resistant material is c-BN, the braze forming material 80 is preferably selected from the group of braze forming materials 80 consisting of Mo, Ni, Fe, Co, Al, Si, Ti and Zr, and combinations thereof.

As shown in FIG. 4A, the step S230 of providing the braze forming material 80 may comprise the step S231 of coating the unfinished substrate holder 60', and in particular at least the portions of the body to which the wear-resistant material is to be provided (such as the distal end surfaces of the unfinished burls 20'), with the braze forming material 80. Alternatively or additionally, at least the surface of the wear-resistant material 30 that is to be connected to the body may be coated with the braze forming material 80. In an embodiment, the side of the carrier film 74 on which the wear-resistant material 30 is provided is also coated with the braze forming material 80, avoiding the need for masking and making provision of the braze forming material 80 simpler. The thickness of the braze forming material 80 is preferably less than, more preferably less than half, of the thickness $t_1$ of the wear-resistant material 30. This ensures that, after brazing, the desirable chemical and structural properties of the surface of the wear-resistant material 30 facing away from the unfinished substrate holder 60' are preserved optimally.

As shown in FIG. 4B, the step S230 of providing the braze forming material 80 may further comprise the step S232 of pressing the body (i.e. the substrate holder 60) and the wear-resistant material 30 (or the separated portions 30' of the wear-resistant material 30) together such that the braze forming material 80 is located between the body and the wear-resistant material 30. When the braze forming material 80 is coated on the unfinished substrate holder 60' as shown in FIG. 4A, the wear-resistant material 30 is pressed into the braze forming material 80. Alternatively, when the braze forming material 80 is coated on the wear-resistant material 30, the unfinished substrate holder 60' (and in particular the plurality of unfinished burls 20' of the unfinished substrate holder 60') is pressed into the braze forming material 80. The unfinished substrate holder 60' and the wear-resistant material 30 are pressed together to ensure appropriate wetting by contact of the unfinished substrate holder 60' and the separated portions 30' of the wear-resistant material 30 with the braze forming material 80.

Figure 4C:
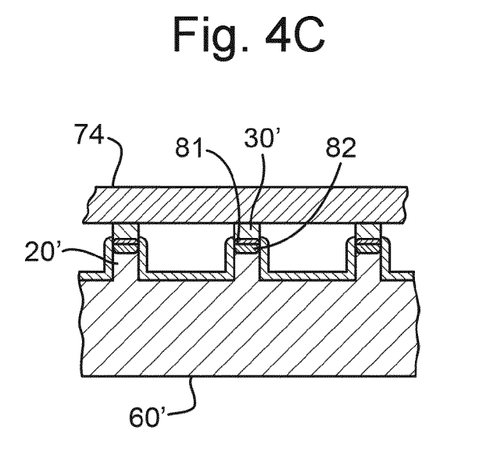

FIG. 4B also schematically shows the step S240 of brazing the wear-resistant material 30 to the body by heating the braze forming material 80. The braze forming material 80 may be heated, for example, to a temperature in the range from 500 to 1500° C. Alternatively, the braze forming material 80 may be heated to higher temperatures, for example when using 10 to 100 ns laser irradiation heating while providing a relatively cold body. When the braze forming material 80 is heated, the braze forming material 80 may chemically bind with and/or diffuse into the body and/or wear-resistant material 30, thus forming an intermediate brazing layer 81, 82. As shown in FIG. 4C, the intermediate brazing layer 81,82 may comprise or consist of a first portion 81 formed by the braze forming material 80 diffusing into the wear-resistant material 30, and a second portion 82 formed by the braze forming material 80 diffusing into the unfinished substrate holder 60' or other body.

The portions of the braze forming material 80 that serve to connect the wear-resistant material 30 to the body are preferably heated locally, i.e. only these portions of the braze forming material 80 and the regions of the body and wear-resistant material 30 adjacent to these portions of the braze forming material 80 are heated. The unfinished substrate holder 60' may be not heated entirely, thus reducing the risk of damage to the unfinished substrate holder 60'.

Preferably, the braze forming material 80 is heated by a brazing laser 94, thus laser-brazing the portion of the braze forming material 80 located between the wear-resistant material and the body. This is shown in FIG. 4B. The brazing laser 94 may illuminate and heat the braze forming material 80 through the carrier film 72 and the wear-resistant material 30 (for example when the wear-resistant material 30 is transparent, such as a diamond layer). Alternatively or additionally, the brazing laser 94 may illuminate and heat the braze forming material 80 through the body (not shown). The brazing laser 94 may illuminate the portion of the braze forming material 80 in one or multiple laser pulses. The wavelength of the brazing laser 94 may be chosen such that less than 50%, preferably less than 5%, of the power of the brazing laser 94 is absorbed in the wear-resistant material 30 (when the laser beam is transmitted through the wear-resistant material) or the body (when the laser beam is transmitted through the body). This ensures that most of the power of the brazing laser 94 is absorbed by the braze forming material. Typically, each laser pulse may have a duration from 1 to 100 ns and a fluence in the range from 0.05 to 5 J/cm². Alternatively, each laser pulse may have a duration of less than 1 ns, with a reduced fluence in the range from 0.01 to 1 J/cm². Using a brazing laser 94 allows rapid heating of the portion of the braze forming material 80 that is illuminated, reducing the heating impact on the area surrounding the illuminated portion and thus reducing the risk of damage to the unfinished substrate holder 60'.

The brazing laser 94 may also be used to heat the wear-resistant material, for example when the wear-resistant material is c-BN (which is unstable at temperatures exceeding 1500° C.). This heats the braze forming material through conductive heat transfer, because the wear-resistant material is in physical contact with the braze forming material 80, thus brazing the wear-resistant material to the body.

Heating devices other than the brazing laser 94 may also be used to locally heat the braze forming material 80. For example, the braze forming material 80 could be heated locally through conductive heat transfer by directly contacting the braze forming material 80 with a heating device (for example, by heating of the carrier film 72 and contact heating of the separated portions 30' of the wear-resistant material 30). Alternatively, for braze forming materials 80 that can chemically react with and/or diffuse into the unfinished substrate holder 60' and the wear-resistant material 30 at temperatures below 300° C., the entire unfinished substrate holder 60' may be heated. This is because the unfinished substrate holder 60' can withstand such low temperatures.

After the step S240 of brazing, the carrier film 72 may be separated from the wear-resistant material 30. If the carrier film 72 is provided with the optional adhesive layer, this adhesive layer can be heated to facilitate separation of the wear-resistant material 30 from the carrier film 72. Excessive braze forming material 80, such as the braze forming material 80 provided on portions of the unfinished substrate holder 60' that are not provided with the wear-resistant material 30, may be removed. After brazing, the surface of the wear-resistant material 30 facing away from the unfinished substrate holder 60' defines a support plane SP for supporting a planar surface of an object (such as the substrate W) that is to be supported. Optionally, the wear-resistant material 30 may be polished and planarized after brazing to ensure that the support plane SP defined by the wear-resistant material 30 meets the specifications required for use in the lithographic apparatus LA.

Figure 4D:
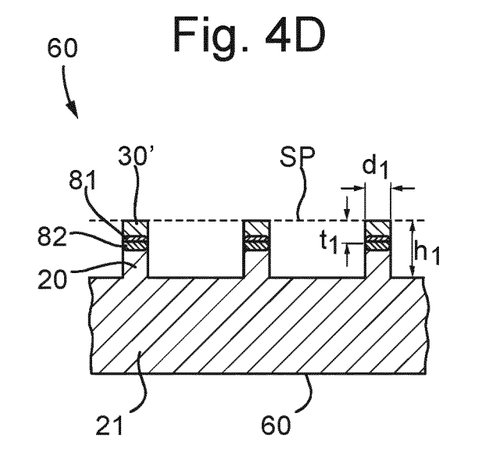
FIG. 4D depicts a composite body according to an embodiment.

FIG. 4D shows the final composite body that is obtained by the method 200 depicted in FIGS. 4A to 4D. The final composite body is the substrate holder 60. The unfinished burls 20' in combination with the intermediate brazing layer 81,82 and the wear-resistant material 30 make up the burls 20 of the substrate holder 60.

Figure 5A:
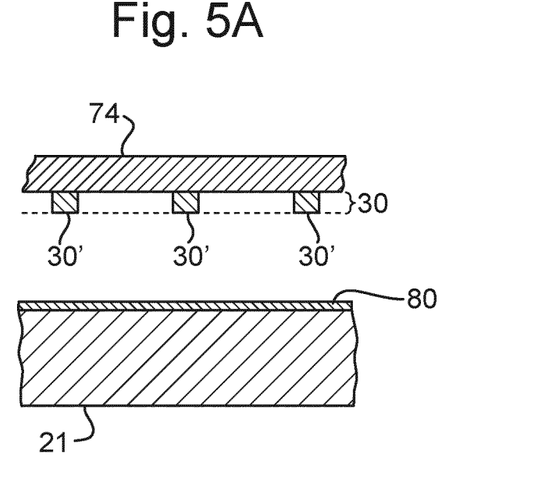
Figure 5B:
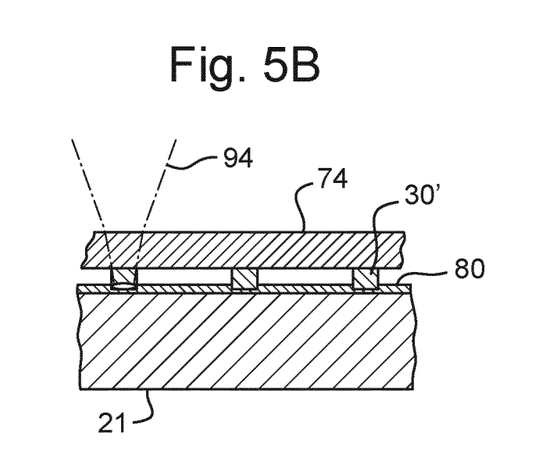
Figure 5C:
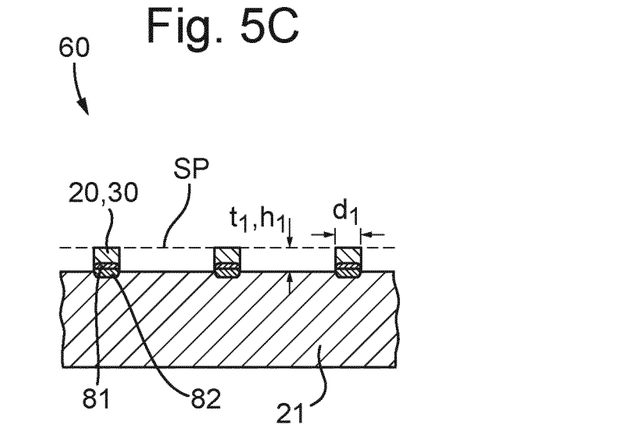
FIG. 5C depicts a composite body according the other embodiment.

FIGS. 5A to 5C show another embodiment of the method 200 for providing the wear-resistant material on the body. This embodiment differs from the embodiment of FIGS. 4A to 4D in that the wear-resistant material 30 is not provided on the pre-fabricated unfinished burls 20' of the unfinished substrate holder 60'. Instead, the wear-resistant material 30 forms the plurality of burls 20 projecting from the main body surface 22 of the main body 21 of a substrate holder blank or template.

In the embodiment of FIGS. 5A to 5C, the body made of glass, ceramic or glass-ceramic is the substrate holder blank. The substrate holder blank may be made of SiC or SiSiC. The substrate holder blank comprises the main body 21 having the main body surface 22. The main body surface 21 is substantially planar. The substrate holder blank does not comprise the plurality of burls 20.

In the embodiment of FIGS. 5A to 5C, the step S220 of providing the wear-resistant material is as described in relation to FIGS. 4A to 4D. Providing the wear-resistant material 30 in a plurality of separated regions 30' allows the wear-resistant material 30 to form the plurality of burls 20 on the substrate holder blank, thereby forming the substrate holder 60. When the wear-resistant material 30 is used to form the plurality of burls 20, the wear-resistant material 30 has a thickness $t_1$ (in a direction perpendicular to the main body surface 22) that is equal to the height $h_1$ of the desired burls 20, preferably from 10 μm to 500 μm. The diameter $d_1$ of the separated regions 30' may be in the range from 50 μm to 300 μm, e.g. about 200 μm. The distance between the centers of two adjacent separated regions 30' may be about 0.5 mm to 3 mm, e.g. about 1.5 mm. The shape of the separated regions 30' may be circular in plan, so as to form circular burls 20. The separated regions 30' can also be formed in other shapes if desired.

In the embodiment of FIGS. 5A to 5C, the braze forming material 80 is as described in relation to FIGS. 4A to 4D. The entire main body surface 22 of the substrate holder blank, or at least the portions of the main body surface 22 to which the wear-resistant material 30 is to be applied, are coated with the braze forming material 80. Alternatively or additionally, the surface of the wear-resistant material 30 that is to be connected to the substrate holder blank may be coated with the braze forming material 80. The braze forming material 80 is then (locally) heated so as to form an intermediate brazing layer 81,82 connecting the wear-resistant material 30 to the substrate holder blank, for example in the manner already described in relation to FIGS. 4A to 4D. The carrier film 74 and excessive braze forming material 80 may be removed, and optionally the braze forming material 30 may be polished and planarized, so as to form the composite body depicted in FIG. 5C.

FIG. 5C shows the final composite body that is obtained by the method 200 depicted in FIGS. 5A to 5C. The final composite body is the substrate holder 60. The first portion 81 of the intermediate brazing layer and the wear-resistant material 30 make up the burls 20 of the substrate holder 60.

FIGS. 4 and 5 schematically depict the steps of the method 200 of FIG. 3A for providing the wear-resistant material on the body. The method 201 of FIG. 3B may be carried out as described in relation to FIGS. 4 and 5, with the exception that no braze forming material 80 is provided between the wear-resistant material 30 and the body. Instead of the braze forming laser 94, a ps- or fs-pulsed laser may be used to laser weld the wear-resistant material 30, or each separated portion 30' of the wear-resistant material 30, to the body. Preferably, the wear-resistant material 30 is transparent (to the ps- or fs-pulsed laser) and the body is opaque (to the ps- or fs-pulsed laser), and the ps- or fs-pulsed laser exposes the interface between the body and the wear-resistant material 30 through the wear-resistant material 30. The ps- or fs-pulsed laser may emit laser pulses having a duration of less than 100 ps, preferably less than 10 ps. Each laser pulse may have a fluence at its focus of more than 0.01 $J/cm^2$, preferably 0.1 to 1 $J/cm^2$. The ps- or fs-pulsed laser may be focused on at least a portion of the interface between each separated region 30' of wear-resistant material 30 and the body, achieving highly localized heating to temperatures exceeding 1000 K at this interface. Such highly localized heating leads to diffusion of the wear-resistant material 30 into the glass, ceramic, or glass-ceramic material of the body, and/or vice versa. This creates an interdiffusion layer connecting the wear-resistant material 30 to the body, and results in a strong bond between the wear-resistant material 30 and the body.

The method 200 may be used to obtain the composite body according to an embodiment of the invention. FIGS. 4D and 5C schematically depict two embodiments of such a composite body. In the embodiments of FIGS. 4D and 5C, the composite body is the substrate holder 60 for use in the lithographic apparatus LA. Alternatively, the composite body may be any other support structure, such as the reticle clamp or reticle holder for use in the lithographic apparatus LA, a substrate clamp or any other support table for use in the lithographic apparatus LA. The composite body may also be a support structure for use in applications other than the lithographic apparatus LA, for example in a metrology apparatus or other substrate processing device. The composite body may also not be for the purpose of supporting an object, but for any other application that benefits from applying a highly wear-resistant material to a glass, ceramic or glass-ceramic body.

The composite body comprises the body made of glass, ceramic or glass-ceramic, such as the unfinished substrate holder 60' (as in FIG. 4D), the substrate holder blank (as in FIG. 5C), a reticle clamp blank, or any other support structure blank. The composite body also comprises the wear-resistant material 30, for example in form of a wear-resistant layer, having a hardness of more than 20 GPa. The composite body further comprises the intermediate brazing layer 81, 82. The intermediate brazing layer 81, 82 connects the body and the wear-resistant material by brazing. The intermediate brazing layer 81, 82 may comprise the braze forming material 80 that is diffused into the body and into the wear-resistant material. The intermediate brazing layer 81, 82 can readily be detected when inspecting the composite body using focused ion beam (FIB) systems in transmission electron microscopes (TEM), Raman spectroscopy, or through visual inspection using an optical microscope.

The composite body may thus be used as a substrate holder 60 or other support structure in the lithographic apparatus LA or in other applications. If the intermediate brazing layer 81, 82 of the composite body fatigues, for example after a predetermined number of load/unload cycles of the substrate W, mask MA or other object from the composite body, the intermediate brazing layer 81, 82 can be repaired. This can be achieved by heating the intermediate brazing layer 81, 82. Such heating may be done using the brazing laser 94 using similar or lower irradiation compared to the original brazing step.

Method 201 can be used to obtain a composite body according to an alternative embodiment of the invention. This composite body may be as described above, with the exception that an interdiffusion layer is provided instead of the intermediate brazing layer 81, 82. The interdiffusion layer is formed by laser welding the wear-resistant material 30 to the body. The interdiffusion layer comprises a gradient in (elemental) composition from the glass, ceramic, or glass-ceramic material of the body to the wear-resistant material. The interdiffusion layer can be detected and/or repaired in the same way as the intermediate brazing layer 81, 82.

FIGS. 6A to 6D schematically depict a preferable embodiment of the step S220 of providing the wear-resistant material. Step S220 preferably comprises growing a layer of material 31 having a hardness of more than 20 GPa, such as a layer of diamond, c-BN, $C_3N_4$, $Si_3N_4$, $AlMgB_{14}$, $Al_2O_3$, $WB_4$, VyBx, TayBx, ZryBx, NbyBx, $c-BC_2N$, other C-B-N ternary compounds, or any combination thereof on a growth substrate 72 (S221). The growth substrate may, for example, be made of mono- or polycrystalline SiC, Si or sapphire. The layer of material 31 may be grown under optimal conditions, for example using enhanced vapour deposition at a growth substrate temperature from 500° C. to 1200° C. The optimal growth conditions will depend on the material to be grown. Other methods to grow or produce crystalline, hard films, such as high pressure, high temperature sintering/hot pressing, may also be used to provide the layer of material 31. At least portions of the layer of material 31 may then be transferred from the growth substrate 72 to the carrier film 74 (S222), thereby forming the wear-resistant material 30 on the carrier film 74. The portions of the layer of material 31 that are transferred to the carrier film 74 correspond to the separated portions 30' of the wear-resistant material 30 that is to be applied to the body. The pattern of the portions of the layer of material 31 that are transferred is thus equal to the pattern of the wear-resistant material 30 that is to be applied to the body.

Figure 6A:
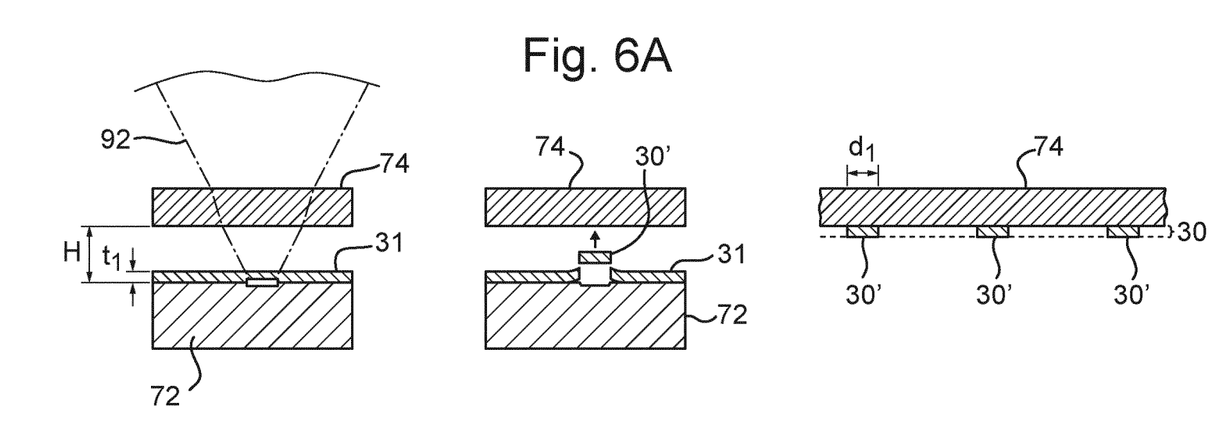
FIGS. 6A to 6D schematically depict the method steps for providing a wear-resistant material.
Figure 6B:
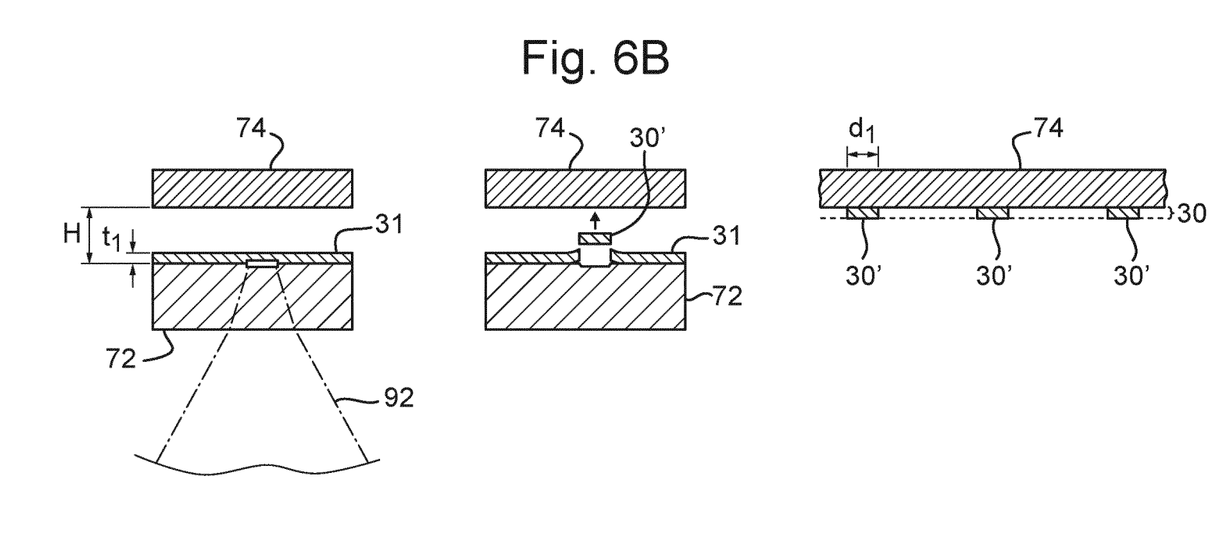

As shown in FIGS. 6A and 6B, laser induced delamination may be used to transfer the portions of the layer of material 31 to the carrier film. A delamination laser 92 may illuminate the portions of the layer of material 31 that are to be transferred, for example using a femtosecond (fs) pulsed laser beam. The delamination laser 92 may emit laser pulses having a duration of less than 500 fs, preferable less than 100 fs. The fluence of these laser pulses may be greater than 0.1 $J/cm^2$, preferably greater than 1 $J/cm^2$. This causes ablation in the illuminated region at the interface between the growth substrate 72 and the layer of material 31, such that the portion of the layer of material 31 is delaminated and sent towards the carrier film 74 or the optional adhesive layer on the carrier film 74. The optional adhesive layer has the added benefit of reducing the risk of the delaminated portion bouncing off the carrier film 74 instead of adhering to the carrier film 74.

The delamination laser 92 may illuminate the portions of the layer of material 31 through the carrier film 74 (as shown in FIG. 6A), for a so-called backward transfer of the portions of the layer of material 31 to the carrier film 74. Alternatively, the delamination laser 92 may illuminate the portions of the layer of material 31 (e.g. c-BN) through the growth substrate 72 (as shown in FIG. 6B), for a so-called forward transfer of the portions of the layer of material 31 to the carrier film 74. The transfer step should preferably be performed in low pressure or under vacuum. During the transfer step, the distance H between the carrier film 74 and the layer of material 31 is preferably less than 1 mm, more preferably less than 100 μm, to ensure accurate positioning of the separated portions 30' on the carrier film 74.

Figure 6C:
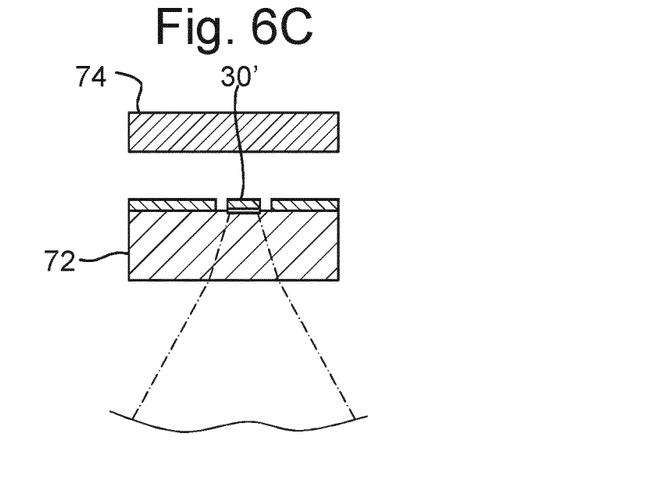
Figure 6D:
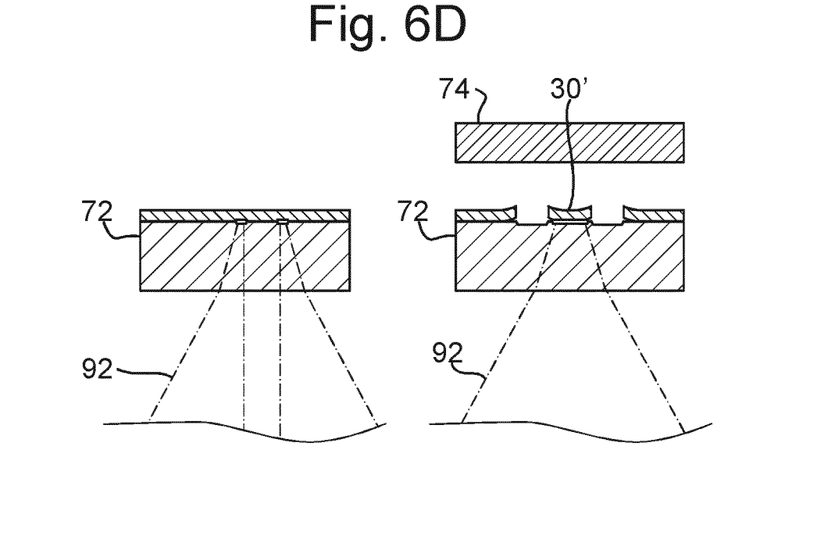

Optionally, prior to laser-induced delamination, the layer of material on the growth substrate 72 may be pre-patterned to assist transfer of the portions of the layer of material 31 to the carrier film 74. This is schematically depicted in FIGS. 6C and 6D. Such pre-patterning is especially useful for the transfer of portions of relatively thick layers of material 31, such as a layer of material 31 with a thickness of more than 10 μm. For example, as shown in FIG. 6C, the portions of the layer of material 31 surrounding the portions to be transferred, or the entire part of the layer of material 31 that is not to be transferred, may be etched prior to laser-induced delamination. This ensures a delamination process that is more precise and leads to less damaged transferred portions. Alternatively, as shown in FIG. 6D, laser induced delamination may be used in a first step to delaminate and remove the portions of the layer of material 31 surrounding the portions to be transferred. The portions to be transferred can then be delaminated and transferred to the carrier film 74 in a second step using laser-induced delamination.

The present invention is not limited to providing the wear-resistant material on a carrier film 74 using the laser-induced delamination process of FIGS. 6A to 6D. Instead of growing the layer of material 31 and then transferring portions of this layer of material 31 to the carrier film 74 to create the wear-resistant material, the wear-resistant material may be grown in a plurality of separated portions 30', for example using a mask during enhanced vapour deposition on the growth substrate 72. The wear-resistant material may also be grown directly on the carrier film 74, or be transferred directly from the growth substrate 72 to the body.

Although specific reference may be made in this text to the use of the lithographic apparatus LA in the manufacture of ICs, it should be understood that the lithographic apparatus LA described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains one or multiple processed layers. While specific embodiments of the invention have been described above, it will be appreciated that the invention may be practiced otherwise than as described. The descriptions above are intended to be illustrative, not limiting. Thus, it will be apparent to one skilled in the art that modifications may be made to the invention as described without departing from the scope of the claims set out below.

The invention may further be apparent from the following numbered clauses.

1. A method for providing a wear-resistant material on a body, the method comprising the steps of:
   providing a body made of glass, ceramic or glass-ceramic; providing a wear-resistant material having a hardness of more than 20 GPa; and
   brazing or laser welding the wear-resistant material to the body.

2. The method of clause 1, wherein the method is for manufacturing a support structure comprising a plurality of burls defining a support plane for supporting an object, and wherein, after brazing or laser welding, the surface of the wear-resistant material facing away from the body defines the distal end surfaces of the burls.
3. The method of clause 1 or 2, comprising: providing, between the wear-resistant material and the body, a braze forming material suitable for brazing the wear-resistant material to the body; and brazing the wear-resistant material to the body by heating the braze forming material.
4. The method of clause 3, wherein the braze forming material is selected from the group of braze forming materials consisting of Ti, Zr, Mo, Cr, Nb, V, Ta, Ni, Fe, Co, Al, Ag, Au, C, Si, B, or any combination thereof.
5. The method of clause 3 or 4, wherein the step of providing a braze forming material comprises coating at least the portions of the body to which the wear-resistant material is to be provided with the braze forming material and/or coating the surface of the wear-resistant material that is to be connected to the body with the braze forming material, and pressing the body and the wear-resistant material together such that the braze forming material is located between the body and the wear-resistant material.
6. The method of any one of clauses 3 to 5, wherein the step of brazing the wear-resistant material to the body comprises locally heating the braze forming material.
7. The method of clause 6, wherein a brazing laser is used to locally heat the braze forming material and/or at least a portion of the wear-resistant material adjacent to the braze forming material.
8. The method of clause 7, wherein the brazing laser illuminates the braze forming material through the wear-resistant material or through the body.
9. The method of any one of clauses 3 to 8, wherein the thickness of the braze forming material coated on the portions of the body and/or on the wear-resistant material is less than the thickness of the wear-resistant material.
10. The method of clause 1 or 2, comprising laser welding the wear-resistant material to the body by bringing the wear-resistant material into physical contact with the body, and exposing the interface between the wear-resistant material and the body using a ps- or fs-pulsed laser.
11. The method of clause 10, wherein the wear-resistant material is transparent and the body is opaque, and wherein the interface between the wear-resistant material and the body is exposed through the wear-resistant material.
12. The method of any preceding clause, wherein the body is made of SiC or SiSiC.
13. The method of any preceding clause, wherein the body comprises a main body having a main body surface and a plurality of unfinished burls projecting from the main body surface, each unfinished burl having a distal end surface, and wherein the wear-resistant material is provided on the distal end surface of each of the plurality of unfinished burls so as to form a support structure comprising a plurality of burls, the distal end surfaces of the plurality of burls defining a support plane for supporting a planar surface of an object.
14. The method of clause 13, wherein the wear-resistant material has a thickness from 0.1 μm to 10 μm.
15. The method of any one of clauses 1 to 12, wherein the body comprises a main body having a main body surface, and wherein, after brazing or laser welding, the wear-resistant material forms a plurality of burls projecting from the main body surface, the plurality of burls defining a support plane for supporting a planar surface of an object.
16. The method of clause 15, wherein the wear-resistant material has a thickness from 10 μm to 500 μm.
17. The method of any preceding clause, wherein the wear-resistant material is one of diamond, c-BN, $Si_3N_3$, $C_3N_4$, $AlMgB_{14}$, $Al_2O_3$, $WB_4$, VyBx, TayBx, ZryBx, NbyBx, c-$BC_2N$, other C-B-N ternary compounds, or any combination thereof.
18. The method of any preceding clause, wherein the wear-resistant material is provided in a plurality of separated portions.
19. The method of any preceding clause, wherein the step of providing the wear-resistant material comprises providing the wear-resistant material on a carrier film.
20. The method of clause 19, further comprising the step of separating the carrier film from the wear-resistant material after the step of brazing.
21. The method of clause 19 or 20, wherein the step of providing the wear-resistant material comprises growing a layer of material having a hardness of more than 20 GPa on a growth substrate; and transferring portions of the layer of material from the growth substrate to the carrier film, thereby forming the wear-resistant material on the carrier film.
22. The method of clause 21, wherein laser-induced delamination is used to transfer the portions of the layer of material to the carrier film.
23. The method of clause 22, wherein, prior to laser-induced delamination, the layer of material on the growth substrate is pre-patterned to assist transfer of portions of the layer of material.
24. A composite body obtainable by the method of any preceding clause.
25. A composite body comprising a body made of glass, ceramic or glass-ceramic, a wear-resistant material having a hardness of more than 20 GPa, and an intermediate brazing layer or an interdiffusion layer connecting the body and the wear-resistant material.
26. The composite body of clause 24 or 25, wherein the composite body is a support structure comprising a plurality of burls defining a support plane for supporting an object, and wherein the surface of the wear-resistant material facing away from the body defines the distal end surfaces of the burls.
27. The composite body of any one of clauses 24 to 26, wherein the support structure is a substrate holder for use in a lithographic apparatus.
28. The composite body of clause 27, wherein the body is an unfinished substrate holder comprising a main body having a main body surface and a plurality of unfinished burls projecting from the main body surface, each unfinished burl having a distal end surface, and wherein the wear-resistant material is provided on the distal end surface of each of the plurality of unfinished burls, thus defining a support plane for supporting a substrate.
29. The composite body of clause 27, wherein the body is a substrate holder blank comprising a main body having a main body surface, and wherein the wear-resistant material forms a plurality of burls projecting from the main body surface, the plurality of burls defining a support plane for supporting a substrate.

30. The composite body of any one of clauses 24 to 26, wherein the support structure is a reticle clamp for use in a lithographic apparatus, the wear-resistant material defining a support plane for supporting a patterning device.

31. The composite body of any one of clauses 24 to 30, comprising the intermediate brazing layer, wherein the intermediate brazing layer comprises a braze forming material that is diffused into the body and into the wear-resistant material.

32. The composite body of any one of clauses 25 to 31, comprising the interdiffusion layer, wherein the interdiffusion layer comprises a gradient in composition from the glass, ceramic or glass-ceramic of the body to the wear-resistant material.

33. Lithographic apparatus comprising the composite body of any one of clauses 24 to 32.

The invention claimed is:

1. A method for providing a wear-resistant material on a body, the method comprising:
   providing a body made of glass, ceramic or glass-ceramic;
   providing a wear-resistant material having a hardness of more than 20 GPa; and
   brazing or laser welding the wear-resistant material to the body.

2. The method of claim 1, wherein the method is for manufacturing a support structure comprising a plurality of burls defining a support plane for supporting an object, and
   wherein, after the brazing or laser welding, the surface of the wear-resistant material facing away from the body defines the distal end surfaces of the burls.

3. The method of claim 1, further comprising providing, between the wear-resistant material and the body, a braze forming material suitable for brazing the wear-resistant material to the body; and comprising brazing the wear-resistant material to the body by heating the braze forming material.

4. The method of claim 3, wherein the providing a braze forming material comprises:
   coating at least part of the body to which the wear-resistant material is to be provided with the braze forming material and/or coating the surface of the wear-resistant material that is to be connected to the body with the braze forming material, and
   pressing the body and the wear-resistant material together such that the braze forming material is located between the body and the wear-resistant material.

5. The method of claim 3, wherein a thickness of the braze forming material coated on the body and/or wear-resistant material is less than a thickness of the wear-resistant material.

6. The method of claim 1, comprising laser welding the wear-resistant material to the body and doing so by:
   bringing the wear-resistant material into physical contact with the body, and
   exposing an interface between the wear-resistant material and the body using a ps- or fs-pulsed laser.

7. The method of claim 6, wherein the wear-resistant material is transparent and the body is opaque, and wherein the interface between the wear-resistant material and the body is exposed through the wear-resistant material.

8. The method of claim 1, wherein the body comprises a main body having a main body surface and a plurality of unfinished burls projecting from the main body surface, each unfinished burl having a distal end surface, and
   wherein the wear-resistant material is provided on the distal end surface of each of the plurality of unfinished burls so as to form a support structure comprising a plurality of burls, the distal end surfaces of the plurality of burls defining a support plane for supporting a surface of an object.

9. The method of claim 1, wherein the body comprises a main body having a main body surface, and wherein, after brazing or laser welding, the wear-resistant material forms a plurality of burls projecting from the main body surface, the plurality of burls defining a support plane for supporting a surface of an object.

10. The method of claim 1, wherein the providing the wear-resistant material comprises providing the wear-resistant material on a carrier film.

11. The method of claim 10, wherein the providing the wear-resistant material comprises:
    growing a layer of material having a hardness of more than 20 GPa on a growth substrate; and
    transferring portions of the layer of material from the growth substrate to the carrier film, thereby forming the wear-resistant material on the carrier film.

12. A composite body obtainable by the method of claim 1.

13. A composite body comprising:
    a body made of glass, ceramic or glass-ceramic,
    a wear-resistant material having a hardness of more than 20 GPa, and
    an intermediate brazing layer or an interdiffusion layer connecting the body and the wear-resistant material.

14. The composite body of claim 13, wherein the composite body is a support structure comprising a plurality of burls defining a support plane for supporting an object, and
    wherein a surface of the wear-resistant material facing away from the body defines the distal end surfaces of the burls.

15. A lithographic apparatus comprising the composite body of claim 13.

16. The composite body of claim 13, wherein the body is an unfinished substrate holder comprising a main body having a main body surface and a plurality of unfinished burls projecting from the main body surface, each unfinished burl having a distal end surface, and wherein the wear-resistant material is provided on the distal end surface of each of the plurality of unfinished burls, thus defining a support plane for supporting a substrate.

17. The composite body of claim 13, wherein the body is a substrate holder blank comprising a main body having a main body surface, and wherein the wear-resistant material forms a plurality of burls projecting from the main body surface, the plurality of burls defining a support plane for supporting a substrate.

18. The composite body of claim 13, wherein the body is a support structure for a patterning device clamp for use in a lithographic apparatus, the wear-resistant material defining a support plane for supporting a patterning device.

19. The composite body of claim 13, comprising the intermediate brazing layer, wherein the intermediate brazing layer comprises a braze forming material that is diffused into the body and into the wear-resistant material.

20. The composite body of claim 13, comprising the interdiffusion layer, wherein the interdiffusion layer comprises a gradient in composition from the glass, ceramic or glass-ceramic of the body to the wear-resistant material.

* * * * *